United States Patent [19]

Stucker

[11] Patent Number: 4,673,874
[45] Date of Patent: Jun. 16, 1987

[54] ANNULAR ROTOR DISK FOR ELECTRIC METER

[75] Inventor: Harold L. Stucker, Somersworth, N.H.

[73] Assignee: General Electric Company, Somersworth, N.H.

[21] Appl. No.: 711,643

[22] Filed: Mar. 14, 1985

[51] Int. Cl.$^4$ ............................................. G01R 11/02
[52] U.S. Cl. .............................. 324/137; 324/154 R; 324/107
[58] Field of Search .......................... 310/268, 43, 45; 335/225; 324/137, 154 R, 152, 107

[56] References Cited

U.S. PATENT DOCUMENTS 2,913,667  11/1959  Lenehan ............................... 324/107

FOREIGN PATENT DOCUMENTS 420376   3/1967   Switzerland ........................ 324/137
583357  12/1946   United Kingdom ................. 324/137

Primary Examiner—Reinhard J. Eisenzopf
Assistant Examiner—Jose M. Solis
Attorney, Agent, or Firm—Robert E. Brunson; Thomas R. Morrison

[57] ABSTRACT

A disk for an electric meter includes a solid annulus of a conductive material with a center of the annulus filled with a non-conducting material. The non-conducting material is preferably molded in place both to capture the annulus and to secure a disk shaft into a unitary assembly. The annulus distorts eddy currents at distances from sets of potential and current stators of the electric meter to minimize radial components of eddy currents in the vicinity of neighboring sets of potential and current stators. The reduced radial components of eddy currents reduces the constructive or destructive interaction of the eddy currents with their neighboring sources of flux. Increasing the angular separation of the sets of potential and current stators further reduces interaction.

12 Claims, 8 Drawing Figures

ANNULAR ROTOR DISK FOR ELECTRIC METER

BACKGROUND OF THE INVENTION

The present invention relates to electric meters and, more particularly, to rotor disks in electric meters for measuring the consumption of electric energy.

Conventional electro-mechanical electric meters employ a conductive metal disk rotated as the rotor of a small induction motor by interaction with fluxes generated by opposed potential and current stators. When the fluxes produced by the current and potential stators are in quadrature, the rotational torque experienced by the disk is proportional to the voltage applied to the load multiplied by the current consumed by the load: that is, the power consumed by the load. Disk rotation is magnetically resisted in proportion to its rotational speed. Thus, the disk speed is proportional to the power consumed by the load. Each rotation of the disk represents a predetermined increment of energy consumed. The rotations of the disk are accumulated over time in a mechanical or electronic accumulator, or register, for billing purposes by the utility supplying the power.

The torque on the disk is produced by eddy currents induced in the disk which interact with the magnetic fields produced by the potential and current stators. A single-phase meter, employing a single potential stator and a single current stator, is capable of using a solid disk of a highly conductive material such as, for example, aluminum. The eddy currents describe expanding circles about poles of the potential and current stators until the eddy currents are blocked by, for example, reaching the edge of the disk after which the circles are distorted into cardioids. The radial components of the eddy currents contribute to rotational torque. The tangential components of eddy currents produce only radial forces which are resisted by conventional bearings.

Problems arise when two or three sets of potential and current stators are required to measure power consumed in a poly-phase system. If two or more sets of potential and current stators are mounted to drive a single solid aluminum disk, the eddy currents circulating about the location of one set of potential and current stators are capable of reacting with the flux about the location of another set of potential and current stators. This reaction between the eddy currents from one source with the flux from a neighboring source may be positive, i.e. contributing to forward disk rotation, or negative, i.e. retarding forward disk rotation. Thus, two or more flux sources on a solid disk are capable of interacting in a way which degrades measurement precision.

One solution for overcoming the interference problem includes employing separate aluminum disks spaced apart concentrically on a single shaft, one for each set of potential and current stators. In this way, the eddy currents in one disk produced by one set of potential and current stators are incapable of reaching any other disk to interfere with the flux from any other set of potential and current stators. This solution is undesirable because of the substantial extra cost and the greatly increased envelope dimensions required.

A further solution, and the one most commonly employed in commercial polyphase meters, employs a laminated disk having, for example about seven mutually insulated metallic layers bonded together. Two or three sets of potential and current stators are angularly spaced apart about the circumference of the laminated disk. Each of the metallic layers includes radial slots extending from their perimeters almost to their centers to separate each layer effectively into a set of independent pie-shaped segments. The angular extent of the pie-shaped segments is selected to block eddy currents originating in one set of potential and current stators from reaching a region where they can interact with the fluxes from any other set of potential and current stators. The fabrication of a laminated disk is expensive and the reduced areas over which eddy currents can flow as a result of interruption by the slots reduces the torque.

A still further solution employs a metallic rotor disk from which an annular portion is removed to form an inner disk and an outer annulus. The removed annulus is filled with a non-conducting material. Process control in maintaining alignment between the inner and outer metallic portions is difficult. In addition, the non-conducting filling the annulus is fragile and makes it difficult to straighten warped portions of the metallic parts which often occur as a result of the process of forming the non-conducting material.

OBJECTS AND SUMMARY OF THE INVENTION

Accordingly, it is an object of the invention to provide a rotatable disk for an electric meter which overcomes the drawbacks of the prior art.

It is a further object of the invention to provide a rotatable disk for an electric meter in which a solid aluminum disk includes an insulating center for reducing the interaction between eddy currents and fluxes originating in different sets of potential and current stators.

It is a still further object of the invention to provide a rotatable disk for an electric meter in which an annulus of aluminum includes a central portion of a plastic resin. The plastic resin may contain adaptation for a reverse rotation detent.

Briefly stated, the present invention provides a disk for an electric meter having a solid annulus of a conductive material, with the center of the annulus filled with a non-conducting material. The non-conducting material is preferably molded in place both to capture the annulus and to secure a disk shaft into a unitary assembly. The annulus distorts eddy currents at distances from sets of potential and current stators of the electric meter to minimize radial components of eddy currents in the vicinity of neighboring sets of potential and current stators. The reduced radial components of eddy currents reduces the constructive or destructive interaction of the eddy currents with their neighboring sources of flux. Increasing the angular separation of the sets of potential and current stators further reduces interaction.

According to an embodiment of the invention, there is provided a rotary disk assembly for an electric meter wherein the rotary disk assembly is subjected to a torque produced by at least first and second eddy currents in reaction to flux from at least first and second sets of opposed potential stators and current stators spaced a predetermined angular distance apart, comprising a conductive annulus having an inner radius and an outer radius, an insulating disk filling the inner radius, a shaft centered in the insulating disk and the inner radius and the outer radius having a proportion effective to distort a direction of the first eddy currents in a vicinity of the second set of opposed potential and current stators to a predominantly tangential direction whereby a minimum interaction between the first eddy currents and flux from the second set of potential and current stators is attained.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
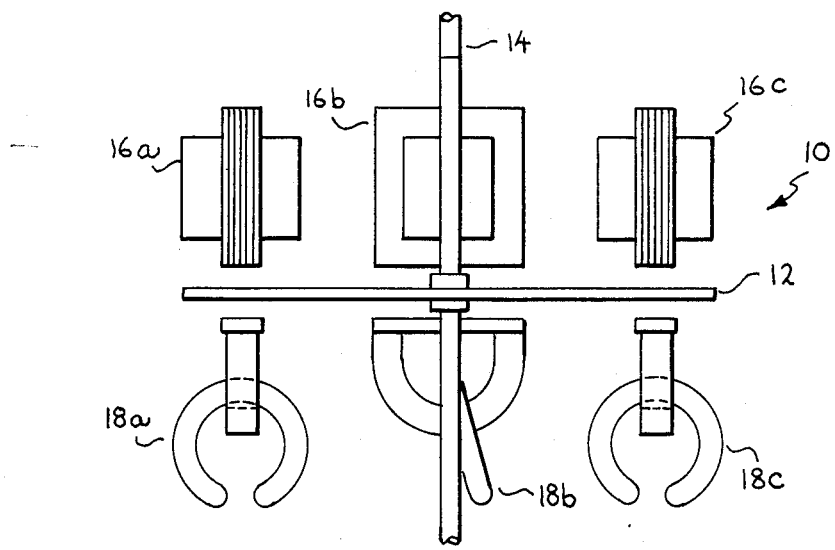
FIG. 1 is a simplified schematic view of a disk of a polyphase electric meter with three sets of potential and current stators.

Referring to FIG. 1, there is shown, generally at 10, an electric meter drive apparatus. A metallic disk 12 is rotatably disposed on a shaft 14. Shaft 14 is rotatably supported on conventional bearings (not shown).

From one to three potential stators 16 may be disposed on one side of metallic disk 12 with a corresponding number of opposing current stators 18 aligned therewith on the opposite side of metallic disk 12. In the embodiment shown, three potential stators 16 a, b and c are disposed opposed to three current stators 18 a, b and c. Voltages from phases A, B and C of a three-phase supply (not shown) are connected across windings in correspondingly lettered potential stators 16. Currents in these phases pass in series through correspondingly lettered current stators 18. The total torque applied to metallic disk 12 is proportional to the total power delivered to the load by the three-phase supply.

Figure 2:
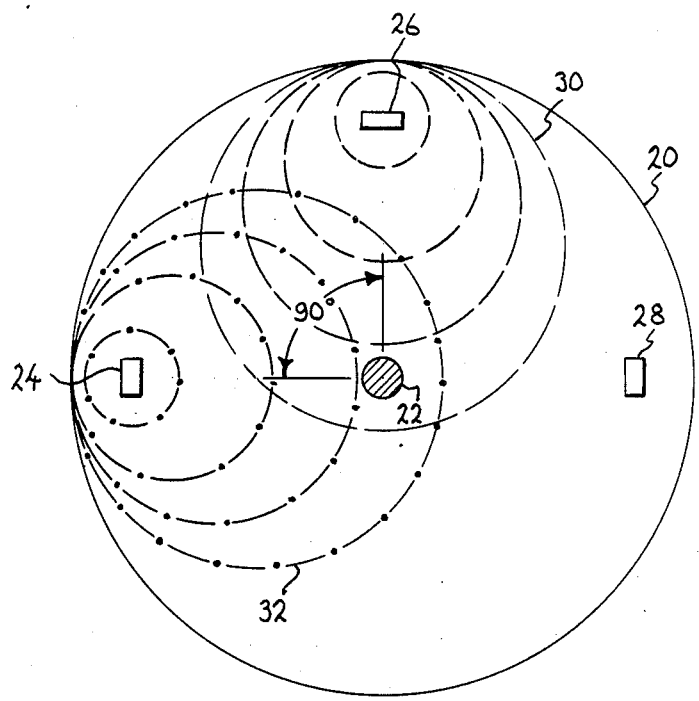
FIG. 2 is a top view of a solid aluminum disk showing eddy current interaction with flux from two angularly separated sources of flux.

Referring now to FIG. 2, the mechanism of interference is shown in a solid aluminum disk 20 which is rotatable about a shaft 22. It is assumed that solid aluminum disk 20 is exposed to flux from three sets of potential and current stators (omitted for clarity) whose active interfaces with solid aluminum disk 20 take place at areas 24, 26 and 28. Areas 24 and 26 are angularly separated by 90 degrees, as are areas 26 and 28. Eddy currents 30 produced by area 26, indicated by dashed lines, circulate through solid aluminum disk 20, including the vicinity of area 24 in which they are capable of constructively or destructively interacting with the flux in area 24. Similarly, eddy currents 32 from area 24, indicated by dot-dash lines, extend into the vicinity of area 26 where they are capable of constructively or destructively interacting with the flux in area 24. Only the radial components of eddy currents 30 and 32 produce rotational torque upon interaction with flux. When radial components of eddy currents 30 and 32 interact with flux from their neighboring area, an error in torque, which may be net positive or negative, results. Tangential components of eddy currents 30 and 32 produce neither torque nor interaction with flux.

Figure 3:
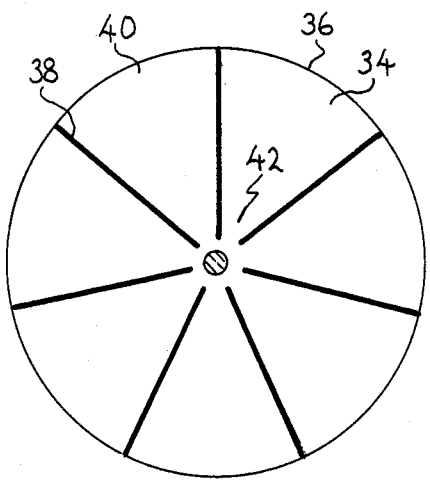
FIG. 3 is a top view of a laminated segmented disk according to the prior art.

Referring now to FIG. 3, there is shown a layer 34 of a laminated disk 36 according to the prior art. A set of seven radial slots 38 extend radially inward from the circumference of layer 34 to divide layer 34 into seven pie-shaped segments 40 which are each effectively isolated from eddy currents in their neighboring pie-shaped segments 40. An unslotted center portion 42 permits handling layer 34 as a single piece during assembly to reduce manufacturing labor. Laminated disk 36 is formed by stacking a plurality of layers 34 with an insulating adhesive therebetween. The angular locations of radial slots 38 are equally displaced from each other so that, when one of radial slots 38 in one of layers 34 lies between a set of potential and current stators, other layers 34 are present in orientations which place pie-shaped segments 40 in position for the development of eddy currents therein.

The number of radial slots 38 depends on the number of sets of potential and current stators used. For example, seven radial slots 38 may be employed in a three-stator meter in which the stators are spaced about 90 degrees apart. Five radial slots 38 are satisfactory in a two-stator meter where the stators may be spaced 180 degrees apart. Similarly, the number of layers 34 laminated to form laminated disk 36 may be varied to achieve a desired amount of torque.

An alternative to laminated disk 36 is desirable because of the high cost and lost torque which this design entails. Means permitting the use of a solid, unlaminated, disk would be ideal.

Figure 4:
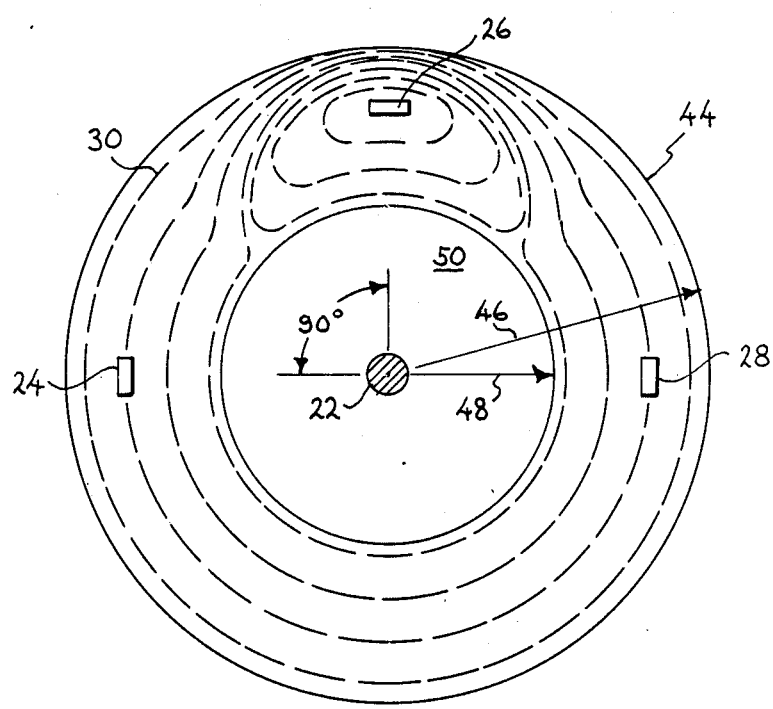
FIG. 4 is a top view of an annulus of solid aluminum showing distortion of the eddy currents from one flux source in the vicinity of an angularly separated second source of flux due to the presence of the opening in the center of the annulus.

Referring now to FIG. 4, such an alternative includes an annulus 44 of solid aluminum having an outer radius 46 and an inner radius 48. Areas 24, 26 and 28 are shown angularly spaced 90 degrees apart. Eddy currents 30, produced by flux in area 26, cannot directly pass across a non-conductive area 50, defined by inner radius 48, to interact with the flux in areas 24 and 28. As a consequence, instead of eddy currents 30 deforming to cardioids having substantial radial components at areas 24 and 28, they deform to sausage shapes near area 26 and further deform to almost completely tangential flow near areas 24 and 28. Thus, interference between eddy currents 30 and the fluxes in neighboring areas 24 and 28 is substantially eliminated. The eddy currents produced by fluxes in areas 24 and 28 (not shown) are similarly distorted to eliminate interference.

Figure 5:
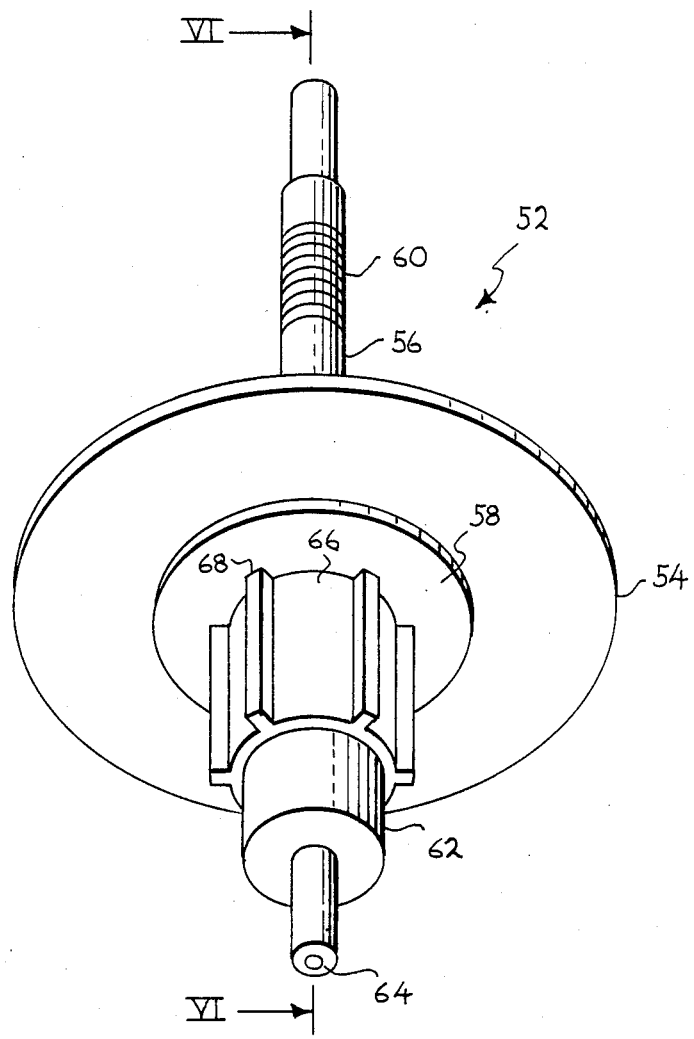
FIG. 5 is a perspective view of a rotary disk assembly according to an embodiment of the invention.
Figure 6:
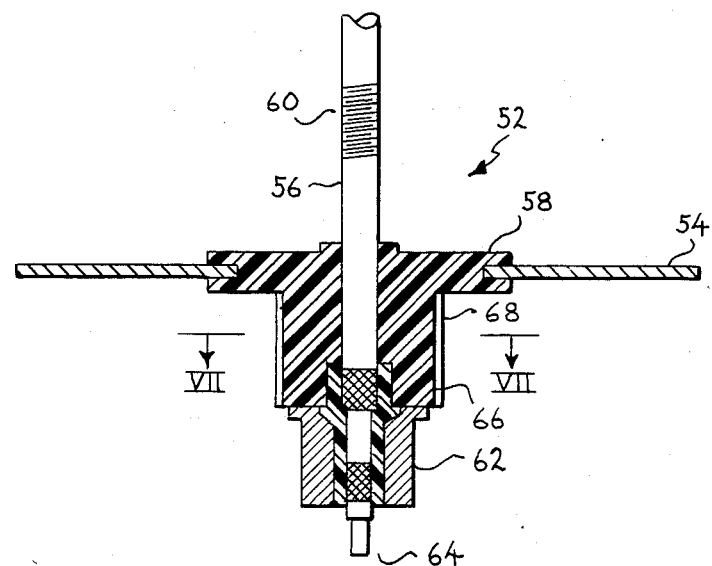
FIG. 6 is a cross section taken along VI—VI in FIG. 5.

Referring now to FIG. 5, there is shown, generally at 52, a rotary disk assembly according to an embodiment of the invention. An annulus 54, preferably of aluminum, is rigidly affixed to a shaft 56 by an insulating disk 58, filling the center opening of annulus 54. A conventional worm 60 is formed on shaft 56 for driving mechanical components of an electric meter (not shown). As also seen in FIG. 6, insulating disk 58 is a plastic resin material and is most preferably a polycarbonate resin material such as, for example, a polycarbonate material sold under the name Lexan by the General Electric Company. A conventional magnetic bearing magnet 62 may be affixed to shaft 56 adjacent a conventional bushing 64. Insulating disk 58 is seen to overlap upper and lower surfaces of annulus 54 for secure retention of annulus 54 to shaft 56.

Some meter applications require a detent for preventing reverse rotation of rotary disk assembly 52 in response to reverse current flow. Only a small percentage of electric meters are conventionally equipped with reverse rotation detents. As a consequence, it is customary to build electric meters without provision for reverse rotation detents and to install such detents on the small fraction requiring them. However, the amount of labor required to install the reverse rotation detents when they are required suggests that rotary disk assembly 52 should contain sufficient provision so that later installation of a reverse rotation detent is simplified.

Figure 7:
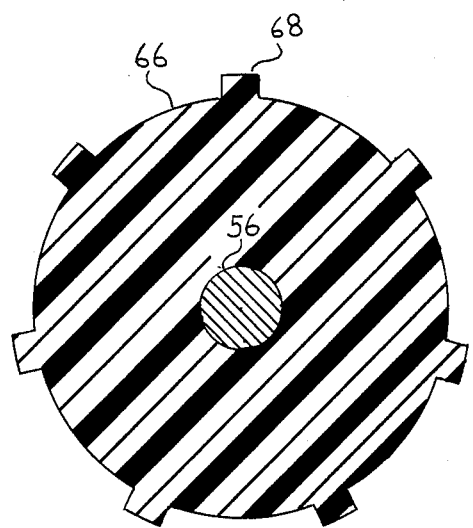
FIG. 7 is a cross section taken along VII—VII in FIG. 6.

Referring now also to FIG. 7, a reverse rotation detent ratchet wheel 66 is integrally formed in the same operation as that forming insulating disk 58. Reverse rotation detent ratchet wheel 66 includes a plurality of equally spaced ratchet bars 68 about its circumference. Except for a one-time cost for adapting a mold to form reverse rotation detent ratchet wheel 66, the provision of reverse rotation detent ratchet wheel 66 is essentially free except for a small incremental cost of the additional plastic used to form it. Thus, it is practical to provide reverse rotation detent ratchet wheel 66 on all rotary disk assemblies 52, even though only a small fraction thereof will receive the additional apparatus, not of concern to the present invention, to use it.

Figure 8:
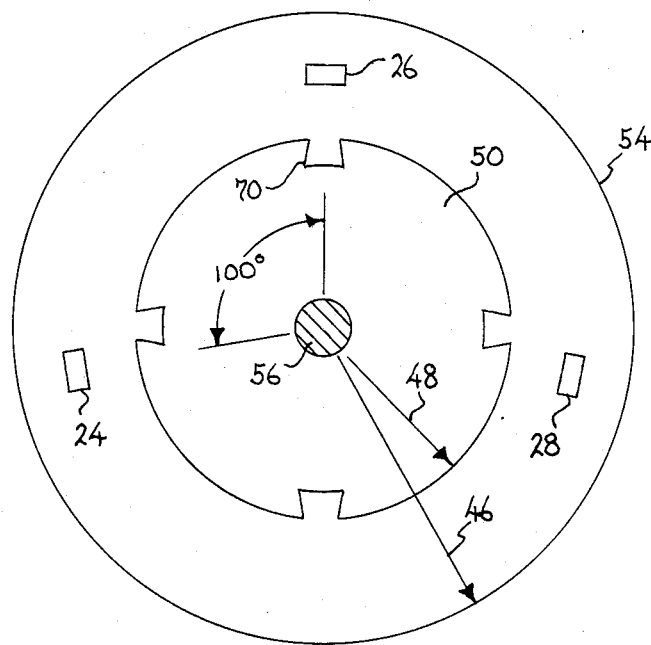
FIG. 8 is a top view of an annulus according to an embodiment of the invention.

Referring now to FIG. 8, annulus 54 is seen to include a plurality, suitably four, keystone-shaped tabs 70 extending radially inward into non-conductive area 50. When the plastic resin filling non-conductive area 50 is formed, keystone-shaped tabs 70 lock the cured resin in place both tangentially and radially.

It will be recalled from the description of FIG. 4 that the present invention relies on deforming the shapes of eddy currents at substantial distances from their sources to reduce the radial component of eddy currents in areas where interference may occur. Increasing the angular separation between areas 24 and 26 and between areas 26 and 28 further enhances this effect. For example, an angle of 100 degrees between areas 24 and 26 substantially reduces the interference compared to a system, more common in the prior art, using a 90 degree separation.

From the standpoint of interference reduction, inner radius 48 should be as large as possible. However, as inner radius 48 is made larger, the effective radial components of eddy currents producing torque reduces. The torque may be increased by increasing outer radius 46, but this is limited by the physical constraints of the package in which rotary disk assembly 52 must be assembled, and by interference with other necessary components in an electric meter. An angular distance of about 100 degrees and a ratio of outer radius 46 to inner radius 48 of from about 1.75 to about 3.0 is preferred. In the preferred embodiment, an outer radius 46 of from about 2.125 to about 2.25 inches, with an inner radius 48 of from about 0.85 to about 1.15 inch, gives satisfactory torque with a substantial reduction in interference when used in a system having the sets of voltage and current stators separated by 100 degrees. In the most preferred embodiment, the inner radius is from about 0.89 to about 1.0 inch. An inner radius of about 0.9 inch is preferred. For different applications and for differenct angular spacing of the sets of voltage and current stators, different combinations of outer radius 46 and inner radius 48 may be selected. One skilled in the art with the present application before him will have no difficulty in selecting appropriate sets of these parameters for a particular application.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A rotary disk assembly for an electric meter wherein said rotary disk assembly is subjected to a torque produced by at least first and second eddy currents in reaction to flux from at least first and second sets of opposed potential stators and current stators spaced a predetermined angular distance apart, comprising:

a conductive annulus having an inner radius and an outer radius;

an insulating disk filling said inner radius;

a shaft centered in said insulating disk;

said outer radius having a ratio to said inner radius effective to distort a direction of said first eddy currents in a vicinity of said second set of opposed potential and current stators to a predominantly tangential direction whereby a minimum interaction between said first eddy currents and flux from said second set of potential and current stators is attained; and said ratio including a ratio of said outer radius to said inner radius of from about 1.75 to about 3.

2. A rotary disk assembly according to claim 1 wherein said conductive annulus is solid aluminum.

3. A rotary disk assembly according to claim 1 wherein said insulating disk is a plastic resin.

4. A rotary disk assembly for an electric meter wherein said rotary disk assembly is subjected to a torque produced by at least first and second eddy currents in reaction to flux from at least first and second sets of opposed potential stators and current stator spaced a predetermined angular distance apart, comprising:

a conductive annulus having an inner radius and an outer radius;

an insulating disk filling said inner radius;

a shaft centered in said insulating disk;

said outer radius having a ratio to said inner radius effective to distort a direction of said first eddy currents in a vicinity of said second set of opposed potential and current stators to a predominantly tangential direction whereby a minimum interaction between said first eddy currents and flux from said second set of potential and current stators is attained;

said ratio including a ratio of said outer radius to said inner radius of from about 1.75 to about 3; and said insulating disk includes a polycarbonate resin.

5. A rotary disk assembly for an electric meter wherein said rotary disk assembly in subjected to a torque produced by at least first and second eddy currents in reaction to flux from at least first and second sets of opposed potential stators and current stator spaced a predetermined angular distance apart, comprising:

a conductive annulus having an inner radius and an outer radius;

an insulating disk filling said inner radius;

a shaft centered in said insulating disk;

said outer radius having a ratio to said inner radius effective to distort a direction of said first eddy currents in a vicinity of said second set of opposed potential and current stators to a predominantly tangential direction whereby a minimum interaction between said first eddy currents and flux from said second set of potential and current stators is attained;

said ratio including a ratio of said outer radius to said inner radius of from about 1.75 to about 3; and a reverse rotation detent ratchet wheel integrally formed with said insulating disk.

6. A rotary disk assembly according to claim 1 wherein said conductive annulus includes at least one radially inward-directed tab in said inner radius.

7. A rotary disk assembly for an electric meter wherein said rotary disk assembly is subjected to a torque produced by at least first and second eddy currents in reaction to flux from at least first and second sets of opposed potential stators and current stator spaced a predetermined angular distance apart, comprising:

a conductive annulus having an inner radius and an outer radius;

an insulating disk filling said inner radius;

a shaft centered in said insulating disk;

said outer radius having a ratio to said inner radius effective to distort a direction of said first eddy currents in a vicinity of said second set of opposed potential and current stators to a predominantly tangential direction whereby a minimum interaction between said first eddy currents and flux from said second set of potential and current stators is attained;

said ratio including a ratio of said outer radius to said inner radius of from about 1.75 to about 3;

said conductive annulus includes at least one inward-directed tab in said inner radius; and said at least one radially inward-directed tab is a keystone-shaped tab.

8. A rotary disk assembly according to claim 1 wherein said ratio and said predetermined angular distance are proportioned to distort a direction of said first eddy currents in a vicinity of said second set of potential and current stators to a predominantly tangential direction whereby a minimum interaction between said first eddy currents and flux from said second set of opposed potential and current stators is attained.

9. A rotary disk assembly for an electric meter wherein said rotary disk assembly is subjected to a torque produced by at least first and second eddy currents in reaction to flux from at least first and second sets of opposed potential stators and current stator spaced a predetermined angular distance apart, comprising:

a conductive annulus having an inner radius and an outer radius;

an insulating disk filling said inner radius;

a shaft centered in said insulating disk;

said outer radius having a ratio to said inner radius effective to distort a direction of said first eddy currents in a vicinity of said second set of opposed potential and current stators to a predominantly tangential direction whereby a minimum interaction between said first eddy currents and flux from said second set of potential and current stators is attained;

said ratio including a ratio of said outer radius to said inner radius of from about 1.75 to about 3;

said ratio and said predetermined angular distance being proportioned to distort a direction of said first eddy currents in a vicinity of said second set of potential and current stators to a predominantly tangential direction whereby a minimum interaction between said first eddy currents and flux from said second set of opposed potential and current stators is attained; and said angular distance is about 100 degrees.

10. A rotary disk assembly for an electric meter wherein said rotary disk assembly is subjected to a torque produced by at least first and second eddy currents in reaction to flux from at least first and second sets of opposed potential stators and current stator spaced a predetermined angular distance apart, comprising:

a conductive annulus having an inner radius and an outer radius;

an insulating disk filling said inner radius;

a shaft centered in said insulating disk;

said outer radius having a ratio to said inner radius effective to distort a direction of said first eddy currents in a vicinity of said second set of opposed potential and current stators to a predominantly tangential direction whereby a minimum interaction between said first eddy currents and flux from said second set of potential and current stators is attained;

said ratio including a ratio of said outer radius to said inner radius of from about 1.75 to about 3;

said outer radius is from about 2.125 to about 2.25 inches; and said inner radius is from about 0.85 to about 1.15 inches.

11. A rotary disk assembly according to claim 10 wherein said inner radius is from about 0.89 to about 1.0 inches.

12. A rotary disk assembly according to claim 11 wherein said inner radius is about 0.9 inch.

* * * * *